United States Patent [19]

Chambers

[11] Patent Number: 4,942,603
[45] Date of Patent: Jul. 17, 1990

[54] METHODS AND APPARATUS FOR PROVIDING RECIPROCAL IMPEDANCE CONVERSION

[76] Inventor: Charles W. Chambers, 1270 John Anderson Dr., Ormond Beach, Fla. 32074

[21] Appl. No.: 117,251

[22] Filed: Nov. 4, 1987

[51] Int. Cl.⁵ .............................................. H04B 3/04
[52] U.S. Cl. ................................... 379/398; 379/344; 379/346; 333/215; 333/24 R
[58] Field of Search ............... 379/338, 340, 341, 344, 379/345, 346, 347, 348, 349, 398, 400, 399, 401, 402, 403, 404, 405, 414, 415, 416, 417; 340/425; 333/24 R, 24 C, 24.1, 24.2, 24.3, 213, 214, 215, 216, 217

[56] References Cited

U.S. PATENT DOCUMENTS

| | | | |
|---|---|---|---|
| 2,742,616 | 4/1956 | Merrill, Jr. | 379/346 X |
| 2,885,492 | 5/1959 | O'Heedene | 340/425 |
| 3,109,147 | 10/1963 | Witt | 333/213 |
| 3,501,716 | 3/1970 | Ferch et al. | 333/215 |
| 3,860,767 | 1/1975 | Boucher et al. | 340/425 |
| 3,867,589 | 2/1975 | Junek | 379/4 |
| 3,904,838 | 9/1975 | Stewart | 379/344 |
| 3,927,280 | 12/1975 | Gupta et al. | 379/346 |
| 4,028,505 | 6/1977 | Fassino | 379/340 |
| 4,032,726 | 6/1977 | Chambers, Jr. | 379/400 |
| 4,112,262 | 9/1978 | Stiefel | 379/344 |
| 4,350,964 | 9/1982 | Chambers, Jr. | 333/213 |
| 4,363,008 | 12/1982 | Chambers, Jr. | 333/24 R |

Primary Examiner—Jin F. Ng
Assistant Examiner—Randall S. Vaas
Attorney, Agent, or Firm—Fitch, Even, Tabin & Flannery

[57] ABSTRACT

A reciprocal impedance conversion network is disclosed. Such conversion network preferably is used in a reciprocal negative impedance repeater for the nonloaded cable facilities of a telephone system. Two independent voltage sources for generating reciprocal negative impedance are connected between a first port and a second port. The first port is operably connected to the first voltage source such that a series negative impedance appears at that port. This port is specifically connected to the switching equipment of the telephone system. The second port is operably connected to the second voltage source such that a shunt negative impedance appears at that port. The second port is specifically connected to the nonloaded cable facilities of the telephone system. The invention further provides a frequency dependent gain circuit which is useful for equalizing the losses along the nonloaded cable facilities. In addition, the invention provides an unconditional stability test for the reciprocal negative impedance repeater which may be performed substantially without test equipment.

30 Claims, 4 Drawing Sheets

METHODS AND APPARATUS FOR PROVIDING RECIPROCAL IMPEDANCE CONVERSION

The invention relates generally to methods and apparatus for reciprocal impedance conversion, and is more particularly directed to such methods and apparatus used in reciprocal negative impedance repeaters adapted for use with nonloaded cable facilities of a telephone system.

Because of losses in many instances it is necessary for the cable facilities of a telephone system to include the amplification of an information signal. Amplification of subscriber signals is accomplished in the voice frequency band by a device usually referred to as a voice frequency repeater, VFR. These devices are also termed more broadly 2W—2W (two-wire) repeaters. Previously, amplification of voice frequencies in two-wire telephone systems has been achieved using the principles of the hybrid transformer repeater or by negative impedance techniques. To achieve the high degree of cable impedance matching necessary for stable operation of either repeater type, it is generally required that a multitude of precision balance networks or line build out sections be used. The cost and complexity of these sections, in addition to their associated alignment problems is much greater than is necessary.

In characterizing negative impedance repeaters, the prior art includes series and shunt negative impedance elements as well as combinations thereof. A widely adopted configuration is the series-shunt bridged-T arrangement which is adapted to provide a relatively fixed overall gain while maintaining a predetermined image impedance. This negative impedance repeater utilizes a passive impedance matching network to correct the line impedance which operates in conjunction with a bridged-T negative impedance gain unit. The impedance matching network is not only adapted to match impedance but also attenuates low frequencies by approximately the same amount that high frequencies are attenuated by the cable facilities. This produces an amplitude equalization, but the combined attenuation of the line and the impedance matching network is relatively substantial such that large portions of the available repeater gain are used only to overcome these losses.

An alternative approach provides a bidirectional bridged-T negative impedance repeater having provisions for matching the image impedance of the repeater to the characteristic impedance of the cable. Such systems are difficult to install and align as different gain and impedance settings are required for every length and gauge of cable. Additionally, as the image impedance of the repeater is adjusted to match the impedance of the cable facilities, a maximum power transfer cannot be obtained in normal repeater applications where one port of the repeater is directly coupled to terminal switching equipment having a characteristic impedance of approximately 600–900 Ohms in series with 2.15 microfarads.

Alignment of the bridged-T negative impedance repeater is further complicated because of its combination of series-shunt negative impedance elements. To perform an unconditional stability test on a two port repeater both ports must be tested with "worst case" conditions. The worst case condition for a series negative impedance is a short circuit and the worst case condition for a shunt negative impedance is the opposite, an open circuit.

However, because bridged-T negative impedance repeaters exhibit both types of impedances at both ports, a difficult four step unconditional stability test is necessitated. All combinations, short on the first port-short on the cable facilities, short on the first port-open on the cable facilities, open on the first port-short on the cable facilities, and open on the first port-open on the cable facilities must be attempted before the repeater can be certified as unconditionally stable. The short circuiting of the cable facilities is particularly difficult because it requires a test person to actually be present at the end of the cable loop to execute the test. Because of the sensitivity of this type of repeater such time consuming alignments may be required for even small changes in network configuration.

SUMMARY OF THE INvENTION

The invention provides a reciprocal impedance conversion network having a first port and a second port for bidirectional transmission through an impedance conversion means. The network is configured such that a signal generator, having a source impedance connected to one port, is able to transmit to a load impedance at the other port. The impedance conversion means connected between the first and second ports provides an input impedance at the transmitting port which is inversely proportional to the load impedance at the receiving port. The load impedance can be different combinations of negative or positive impedances in series or shunt with the receiving port which are then reciprocally reflected to the transmitting port.

In one preferred embodiment the impedance conversion means comprise a pair of voltage sources including a first voltage source for generating a first control voltage and a second voltage source for generating a second control voltage out of phase with the first. The first control voltage is generated proportionally to a first control impedance and the current output by the source generator. This first control voltage is applied to the receiving port and drives the load. The second control voltage is generated proportionally to a second control impedance and the current drawn by the load impedance. The second control voltage is inverted to be of the opposite polarity of the first control voltage and is applied to the transmitting port. The first control voltage drives the load impedance proportionally to the current generated from the source and the second control voltage measures the current through the load and provides a voltage to the first port which is inversely proportional to the load impedance. For transmission in the opposite direction, the roles of the voltage sources reverse.

According to the invention, another preferred embodiment provides negative feedback of a fraction of the first control voltage in combination with the second control voltage to provide a series negative impedance at the first port which is inversely proportional to the load impedance. The second control voltage, because of this feedback, appears as an independent shunt negative impedance which is inversely proportional to the load impedance at the second port. In this configuration the impedance conversion network provides gain and linearity in either transmission direction.

This embodiment is particularly well adapted for use as a reciprocal negative impedance repeater for nonloaded cable facilities of a telephone system. In this embodiment, the port exhibiting the series negative impedance is connected to the switching equipment of a telephone system and the port exhibiting the shunt negative impedance is connected to the nonloaded cable facilities of the telephone system. The switching equipment port is open circuit stable and short circuit unstable while the output cable port is short circuit stable and open circuit unstable. Because the two voltage sources are substantially independent, the unconditional stability of this repeater may be tested by the expedient of a single test where the cable facility is open circuited and the switching equipment port is shorted. Additionally, because the cable port is short circuit stable and the cable impedance for nonloaded cable decreases with additional subscribers; the changing of the cable facilities does not adversely affect the stability of the repeater. Moreover, a shunt across the cable facility, such as by the handset of a lineman, will not adversely affect the stability of the repeater.

According to the invention, a virtual unconditional stability test can be performed for a repeater of this type by merely shorting the switching equipment side of the repeater at a time when the far end of the cable facilities are open circuited. The test takes advantage of the fortuitous fact that it is a normal condition for nonloaded cable to be open circuited at the far end. This is the condition when the subscriber line is idle (subscribers "on hook" during nonuse or by request, or because none are connected to a new cable, etc.) Therefore, there is no need to physically make any changes to the cable port side of the repeater to make this test and consequently no need to have test personnel present, other than at the repeater site.

The invention further provides a frequency dependent gain adjustment means by which gain can be increased or decreased in accordance with cable gauge or cable length. A method of electronic alignment for the invention is provided by this gain adjustment whereby during the unconditional stability test, i.e. while the switching equipment port is shorted, a visual indication from a singing detector is used to determine whether the repeater is oscillating. The gain is increased incrementally to where the repeater begins to sing. In a preferred form the gain control includes a slide switch which incrementally adds resistance. When during the electronic alignment the repeater begins oscillating, the slide switch is backed off one increment such that the oscillation ceases. In this manner the repeater is set for stability at its "worst case" and all other changes cause stability to increase.

Accordingly, it is a major object of the invention to provide a impedance conversion network including the capability of providing bidirectional reciprocal impedance.

It is further an object of the invention to provide a impedance conversion network useful in transmission equipment designs, particularly for reciprocal negative impedance repeaters in the voice frequency range adapted for use with nonloaded cable facilities of a telephone system.

It is further an object of the invention to provide a reciprocal negative impedance repeater which is electronically alignable for gain-equalization settings substantially without the use of test equipment.

Still further is an object of the invention to provide a reciprocal negative impedance repeater for use in the voice frequency band with nonloaded cable facilities with improved stability criteria.

Yet another object of the invention is to provide a reciprocal negative impedance repeater which is linear in operation.

Still another object of the invention is to provide a reciprocal negative impedance repeater which does not need impedance matching networks or line buildout networks.

These and other objects, features and aspects of the invention will be more fully understood and better described if a reading of the following detailed description is undertaken in conjunction with the appended drawings wherein:

DETAILED DESCRIPTION OF THE PREFERRED EMBODIMENTS

In the art of transmission lines, a negative impedance inserted in series with a source and load impedance serves to decrease the impedance of the load presented to the source by increasing the source current. The negative impedance appears to provide a gain which is directly proportional to the magnitude of the negative impedance. As a condition of stability the magnitude of the negative series impedance must always be less than the magnitude of the sum of the load and source impedance. Violation of this condition causes the system to become unstable and to oscillate.

Conversely, a negative impedance inserted in shunt in a network serves to increase the load voltage and thereby increases the apparent load impedance presented to the source. Accordingly, the gain provided by a shunt negative impedance is inversely proportional to the magnitude of the negative impedance. As a condition of stability, the magnitude of the negative shunt impedance must always be greater than the parallel combination of the source and load impedance. Violation of this condition causes the system to become unstable and to oscillate.

It is evident that the application of either series or shunt negative impedance to transmission lines to provide gain without oscillation is extremely dependent upon the predictability of the transmission line impedance characteristics, particularly as those characteristics apply to the stability criteria.

Inductively loaded, or simply loaded telephone transmission cable is implemented by introducing lumped inductance into the transmission line at intervals to maintain a characteristic line impedance at a nominal 600-900 ohms in series with 2.15 microfarads of capacitance. This characteristic impedance is maintained across the audio frequency band, between approximately 300 and 3,000 Hz., and is substantially independent of the length or gauge of the cable. The impedance of nonloaded cable facilities is a function of the gauge of the cable as well as the frequency of the signal applied to the cable by way of contrast.

As a general rule the attenuation, or loss, of telephone cable is dependent upon both the length and the gauge of the cable. In the case of a loaded cable, however, the attenuation for a given length and gauge remains nearly constant over the voice frequency band. This is in fact the reason why telephone cable is loaded. The attenuation characteristic of a nonloaded cable is frequency dependent attenuating higher frequencies to a greater extent than lower frequencies.

Therefore, it will be seen for loaded transmission facilities that the impedance and attenuation are both known and are both substantially frequency invariant. This suggests a determinable amount of negative impedance (a repeater) may be inserted in the line with a reasonable expectation that the system will remain stable. However, in the case of nonloaded lines the frequency dependent characteristics of the cable introduce appreciable difficulties in maintaining stability. Moreover, the nonloaded cable can appreciably change impedance when a subscriber goes from on hook to off hook.

Thus, the variation in impedance and loss which occur on nonloaded cable because of different cable size, different cable lengths, changes in frequency, and conditions such as subscriber calls or a lineman's handset, all tend to destabilize a normal repeater. The invention, in one embodiment to be more fully described hereinafter, provides a repeater which is stabilized for the "worst case" of the variables and becomes more stable as the conditions change.

Figure 1:
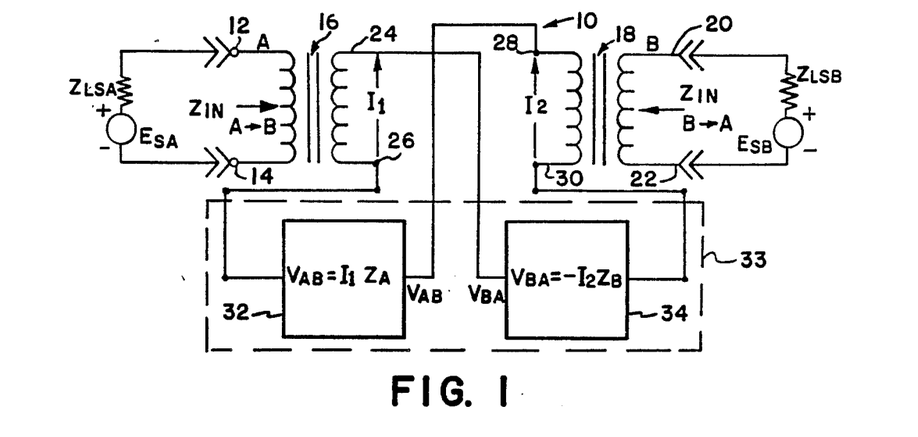
FIG. 1 is an electrical system block diagram of a network having reciprocal impedance generation means constructed in accordance with the invention.

One embodiment of the invention is shown to advantage in FIG. 1 where an impedance conversion network for bidirectional transmissions is shown. The conversion network 10 provides reciprocal impedance conversion for transmission in either direction. The impedance conversion network 10 includes a first Port A having terminals 12 and 14 which are connected respectively to the terminals of the primary of a one to one transformer 16 whose secondary terminals 24 and 26 couple power to the network. The impedance conversion network 10 further includes a second Port B having input terminals 20 and 22 which are respectively connected to the primary of a one to one transformer 18 whose secondary terminals 28 and 30 couple power to the network.

A reciprocal impedance converter 33 is connected between the transformers 16 and 18 and comprises impedance conversion means 32 and 34. Impedance conversion means 32 and 34 generate independent reciprocal impedances for each port. The impedance conversion means 32 generates a voltage Vab which is applied to the secondary terminal 28 of transformer 18. The voltage Vab is generated by the impedance conversion means 32 as a function of the current $I_1$ in the secondary of transformer 16 and a control impedance Za. The preferred function in this embodiment is a linear function where:

$$Za = Vab / I_1$$

Impedance conversion means 34 generates a voltage Vba which is applied to secondary terminal 24 of transformer 16. Voltage Vba is generated as a function of the current $I_2$ in the secondary of the transformer 18 and a control impedance Zb. Preferably, the function is a linear function of the form:

$$Zb = -Vba / I_2$$

In defining transmission direction, the following convention will be used. If a signal generator Esa having a source impedance Zlsa is applied to Port A and a signal generator Esb is set equal to 0, then impedance Zlsb becomes a terminating or load impedance. These are the characteristics of a transmission in a direction from Port A to Port B. For transmission in the other direction, the signal generator Esb having a source impedance Zlsa is applied to terminals 20 and 22 of Port B, where in this instance the generator Esa is set equal to 0 and Zlsa becomes the output or load impedance. These are the characteristics for a transmission from Port B to Port A.

Now, for transmission from Port A to Port B and assuming ideal transformers, the input impedance of Zin of Port A is:

$$Zin = Za \times Zb / Zlsb$$

Similarly the input impedance of Port B, assuming ideal transformers, is:

$$Zin = Za \times Zb / Zlsa$$

From the above equations it is shown that this linear network is bilateral when Za = Zb and the input impedance for each port is inversely proportional to the destination or load impedance for each direction of transmission. It is also evident from this analysis that the input impedances Zin for Port A and Port B can be scaled by the product Za x Zb.

When considering transmission from Port A to Port B the voltage Vba opposes the flow of current $I_1$ in the secondary of transformer 16 and therefore, provides a positive impedance. In this manner voltage Vba appears as a positive impedance to the input of Port A. The voltage Vab on the other hand generates or causes current $-I_2$ and acts as a voltage source to the output impedance Zlsb. In reversing the transmission direction such that information is transmitted from Port B to Port A, the control voltage Vab now opposes the current $I_2$ providing a series positive impedance and voltage Vba generates a negative current $-I_1$ to drive Zlsa. For the impedance conversion network illustrated in FIG. 1 it is a unique feature that the voltages Vab and Vba toggle between being an impedance (current opposer) and a source (current producer) as the direction of the transmission changes. For simultaneous transmissions in both directions, of course, they operate to perform both functions.

If we consider transmission from Port A to Port B with generator Esb set equal to 0, then the output current $I_2$ is:

$$-I_2 = (Esa \times Za) / (ZaZb + Zlsa\, Zlsb)$$

Likewise for transmission from Port B to Port A, with generator Esa set equal to 0, the output current $I_1$ is:

$$I_1 = (Esb \times Zb) / (ZaZb + Zlsa\, Zlsb)$$

The equations illustrate that if Za is not equal to Zb, then the circuit is not bilateral and gain (or loss) are toggled by the scaling of Za with respect to Zb. Furthermore, if the product Za x Zb is kept constant the toggling of gain and loss can be done without changing the input impedance to transmission. When the voltage Vab is a voltage source it is in phase with the voltage Vba, and when the voltage Vba is a voltage source it is out of phase with voltage Vab. The implementation shown in FIG. 1, when Za and Zb are not equal, can be used to implement a switched gain repeater where gain in one direction during transmission is enhanced while loss in the other direction is increased, and vice versa.

In FIG. 1 it is seen that the reciprocal impedances are positive, i.e., there will be an attenuation of the signals provided from the signal generators for transmission in either direction. For repeaters and other network devices it is advantageous to have the input impedance of a transmission apparatus exhibit negative impedance or gain. The impedance conversion means 33 is able to accomplish this task in a bidirectional manner while still providing the function of controlling the input impedance as inversely proportional to the load impedance.

Figure 1A:
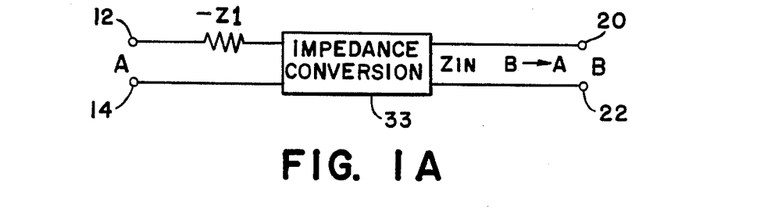
FIGS. 1A-1D are further embodiments of the network illustrated in FIG. 1 for generating reciprocal negative impedance.

FIGS. 1A-1D illustrate specific embodiments of the impedance conversion means 33 used in an impedance conversion network which exhibits reciprocal negative impedance. Reciprocal negative impedance is a negative input impedance which is inversely proportional to the load impedance for the particular direction of transmission. FIG. 1A illustrates a network having a Port A and a Port B where an impedance conversion means 33 is connected between the two ports. A negative impedance $-Z1$ is connected in series with Port A. The impedance conversion means 33 inverts the series negative impedance such that the input impedance Zin of Port B appears as a shunt negative impedance.

Figure 1B:
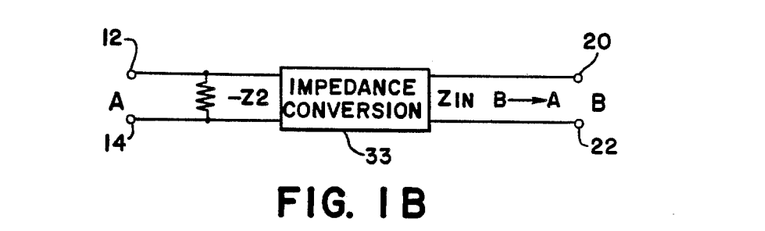

FIG. 1B discloses an embodiment similar to that of FIG. 1A where the series negative impedance $-Z1$ has been replaced by a shunt negative impedance $-Z2$. The impedance conversion means 33 controls the input impedance of Port B such that the reciprocal (a series negative impedance) impedance is exhibited there.

Figure 1C:
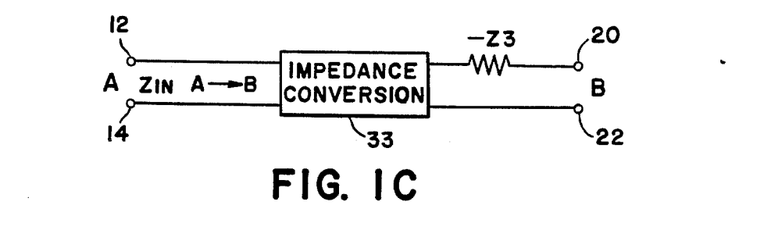
Figure 1D:
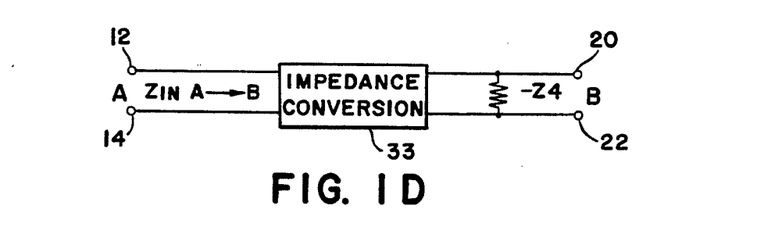

FIGS. 1C and 1D illustrate the impedance conversion means 33 is bidirectional for transmissions. A series negative impedance $-Z3$ connected to Port B will produce a shunt negative input impedance for Port A in FIG. 1C. A shunt negative impedance $-Z4$ connected to Port B will produce a series negative input impedance for Port A in FIG. 1D.

A series or shunt negative impedance can be implemented in numerous ways. For example, impedances $-Z1$, $-Z3$ could be implemented as a series negative impedance repeater and impedances $-Z2$, $-Z4$ as a shunt negative impedance repeater. It is further evident that combinations of impedances (series or shunt), (negative or positive) can be implemented at either port, either alone or in concert with other impedance combinations at the opposite port. For example, the implementations illustrated in FIGS. 1A-1D will in general have a positive load impedance in series or parallel with the negative impedances shown.

Figure 2:
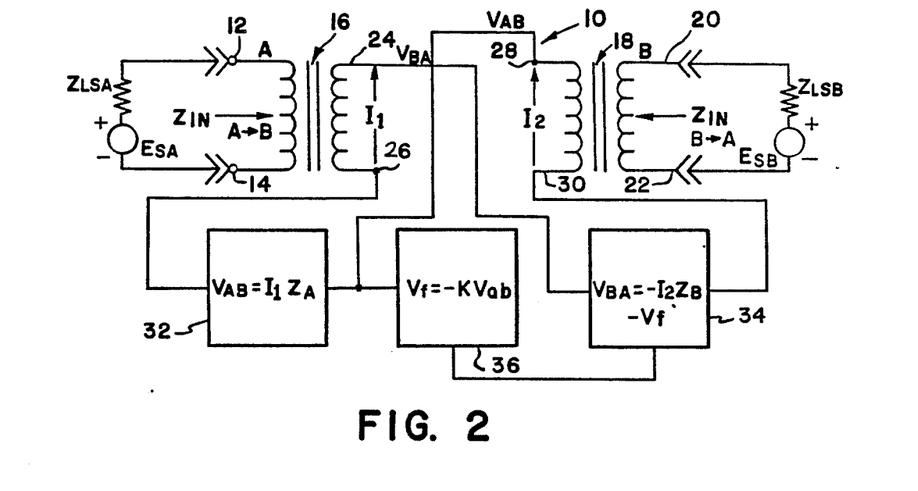
FIG. 2 is an electrical schematic block diagram of a reciprocal negative impedance repeater adapted particularly for use with nonloaded cable facilities of a telephone system.

It is further contemplated by the invention that gain or negative impedance can be provided by the impedance conversion means 32 and 34 while they additionally provide reciprocal impedance conversion. With reference now to FIG. 2 there is illustrated another embodiment of the invention for providing reciprocal negative impedance. The network is similar in operation and structure to that of FIG. 1 with the addition of means 36 for generating a negative feedback voltage Vf from control voltage Vab. The feedback voltage Vf is a selected fraction K of the voltage Vab which is then inverted in polarity before being added to the voltage $-I_2 Zb$ to become the control voltage Vba at the secondary terminal 24 of transformer 16. In operation, when transmitting from Port A to Port B, the negative feedback voltage Vf reduces the voltage Vba (a positive impedance). The result is an increase in $I_1$ and the control voltage Vab, which is the product $I_1 \times Za$, thereby producing a signal gain by driving the load impedance Zlsb. The control voltage Vba, therefore, appears as a series negative impedance at Port A. In reversing transmission direction from Port B to Port A, the feedback voltage Vf increases Vba ($I_1$ is reversed) and hence current $-I_1$ thereby producing a signal gain by driving the load impedance Zlsa. Again the increase in $-I_1$ increases Vab which increases the positive impedance to Port B. This has the effect of reducing $I_2$ relative to the voltage applied by the signal generator at Port B. Because of the signal gain and increase in port impedance, the control voltage Vab, therefore, appears as a shunt negative impedance. It should be especially noted that the FIG. IA and FIG. 2 implementations perform the same functions, i.e., a series negative impedance is exhibited at Port A and a shunt negative impedance at Port B. These implementations are particularly adapted for use as a reciprocal negative impedance repeater for the nonloaded cable facilities of a telephone system where Port A is connected to the switching equipment and Port B is connected to the nonloaded cable facilities.

Further, it is evident that other feedbacks can be made from the impedance conversion means 32, 34 to change the characteristics of the circuit. For example, if the implementation of FIG. IC were to be made using FIG. 4, then a negative fraction of control voltage Vba would be combined with voltage Vab. Other feedbacks are possible and the following rules apply. If the feedback increases the voltage from the source driving the load, then gain or negative impedance will be seen reflected to the source port. If the feedback voltage decreases the input impedance of the port while exhibiting gain, it will cause the port to appear as though a series negative impedance were connected. If the feedback voltage increases the input impedance while exhibiting gain, it will cause the port to appear as though a shunt negative impedance were connected.

Figure 3A:
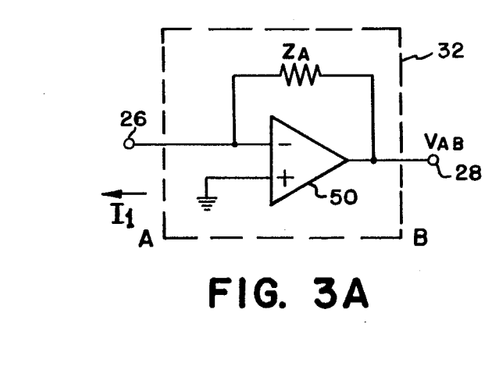
FIGS. 3A-3D are electrical schematic views of preferred implementations of circuitry used to embody the impedance conversion means illustrated in FIGS. 1 and 2.

FIGS. 3A-3D will now be more fully explained to illustrate implementations of the impedance conversion means 32 and 34. FIG. 3a illustrates the generation of the control voltage Vab by an operational amplifier 50. The noninverting input of the operational amplifier 50 is grounded while the control impedance Za is connected between the inverting input and output of the amplifier. The inverting input is further connected to the terminal 26 of the secondary of the transformer 16 of Port A and the output of the amplifier generates the control voltage Vab. In this configuration, the operational amplifier 50 measures the current $I_1$ needed to keep the inverting input at the same reference voltage level as the noninverting input and generates that current through the impedance Za thereby producing the voltage Vab.

Figure 3B:
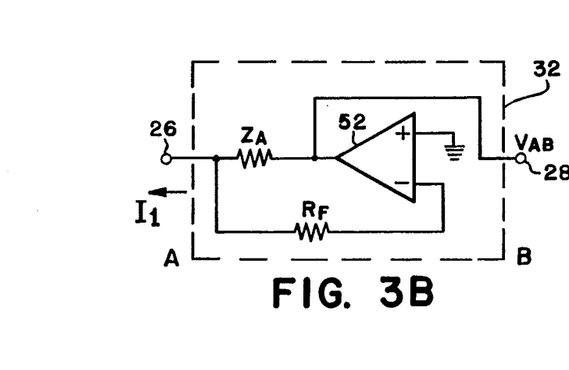

Another circuit implementation is illustrated in FIG. 3B to generate the control voltage Vab. An operational amplifier 52 has its noninverting input grounded and its output connected to the terminal 26 of the secondary of the transformer 16 through the control impedance Za. A feedback resistor Rf is further connected between the control terminal and the inverting input of the amplifier 52. The control voltage Vab is generated from the output of the amplifier. The operational amplifier 52 measures the amount of current $I_1$ which is required to keep the noninverting terminal of the amplifier at ground. This reference voltage level is sensed by the feedback resistor Rf. The necessary current $I_1$ through the impedance Za generates the control voltage Vab.

Figure 3C:
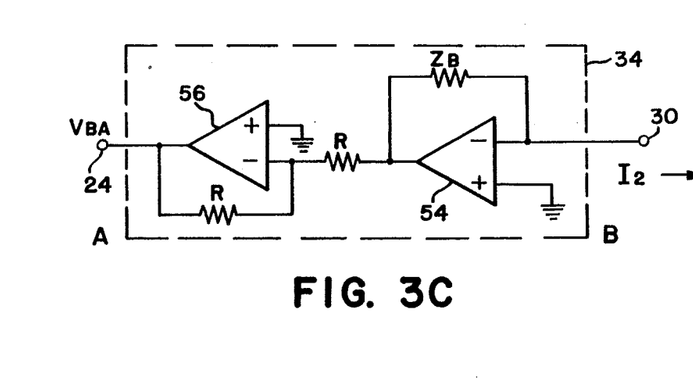

FIG. 3C is a circuit implementation for generating the control voltage Vba. An operational amplifier 54 has its noninverting input grounded and a control impedance Zb connected between its output and inverting input. The inverting input is further connected to the terminal 30 of the secondary of transformer 18. The output of amplifier 54 is connected to an inverting voltage amplifier 56 having a nominal gain of unity. The circuit in FIG. 3C operates similarly to that of FIG. 3A where the operational amplifier 54 measures the amount of current necessary to maintain the inverting input of the amplifier 54 at ground thereby generating a voltage $I_2 \times Zb$. This control voltage is inverted by the operational amplifier 56 to become the control voltage Vba.

Figure 3D:
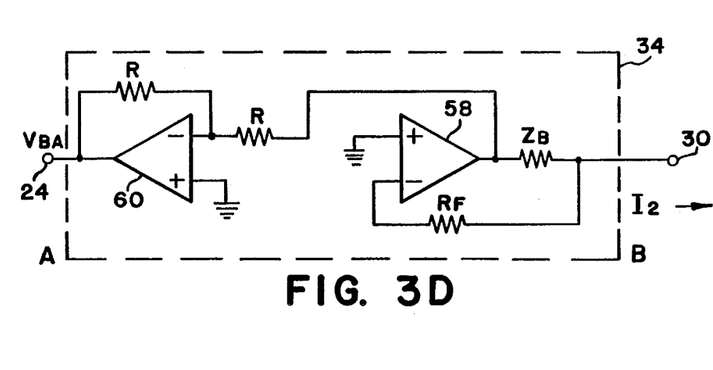

With respect now to FIG. 3D there is shown another preferred implementation of the impedance conversion means 34. The circuit includes an operational amplifier 58 having its noninverting terminal grounded and connected to the secondary terminal 30 of the transformer 18 through the control impedance Zb. A feedback resistor Rf is connected between the terminal 30 and the inverting input of the amplifier. The voltage generated at the output of the amplifier 58 is transferred to a inverting voltage amplifier 60 to become the control voltage Vba at the secondary terminal 24 of transformer 16. The operation of this configuration of impedance conversion means 34 is similar to that shown in FIG. 2b. The current $I_2$ needed to maintain the inverting input at ground, which condition is sensed through resistor Rf, is measured by amplifier 58. The voltage generated, which is $I_2 \times Zb$, is then inverted in the amplifier 60 to become the control voltage of Vba.

Figures 4, 6:
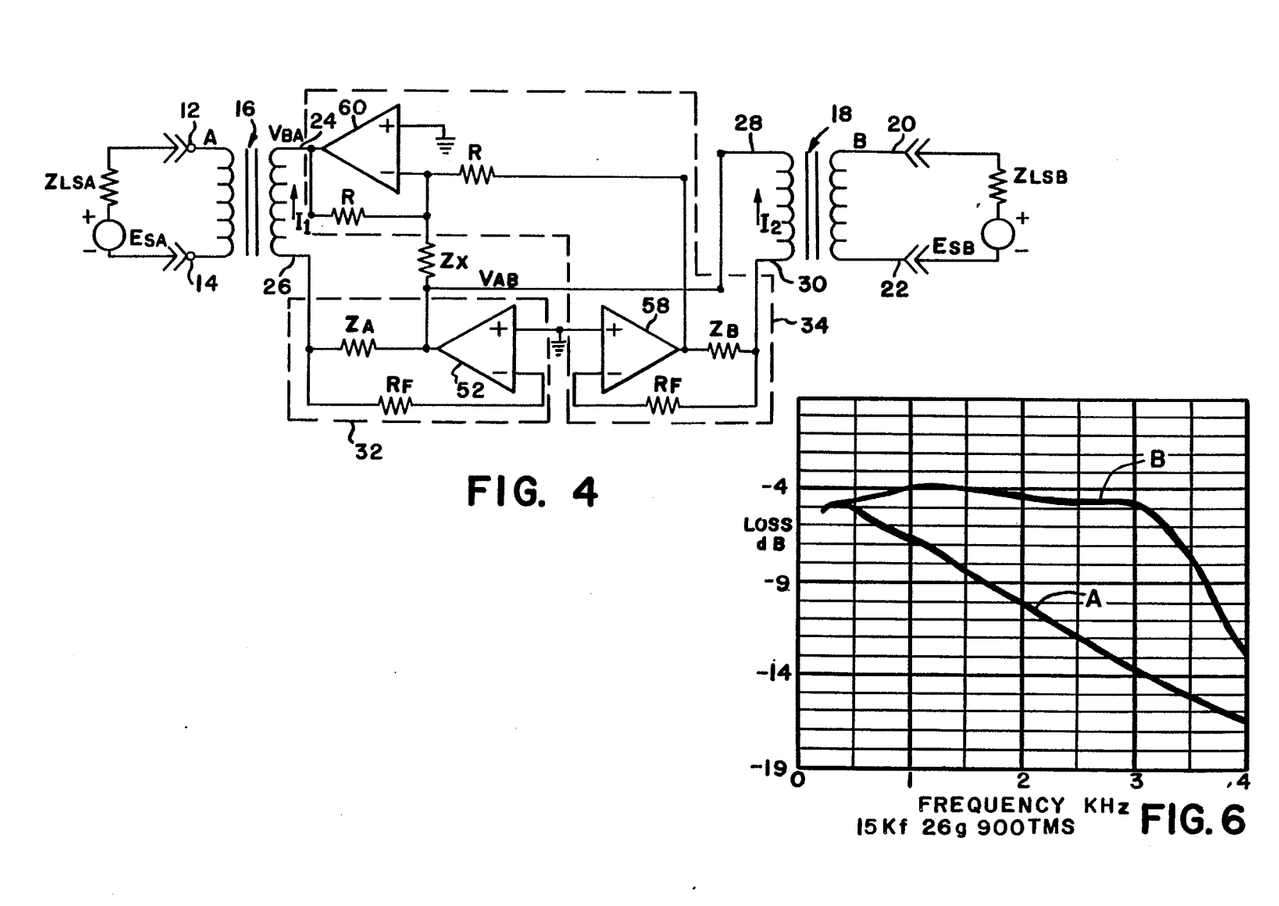
FIG. 4 is a detailed electrical schematic diagram of the reciprocal negative impedance repeater illustrated in FIG. 2 implemented by the impedance conversion means illustrated in FIGS. 3B and 3D.
FIG. 6 is a graphical representation of loss as a function of frequency for a nonloaded cable facility compared with a repeater conditioned signal in accordance with the invention.

FIG. 4 illustrates a detailed circuit implementation of the block diagram of FIG. 2 utilizing the circuit implementations of the impedance conversion means 32 and 34 illustrated in FIGS. 3B and 3D. In addition to the previous elements, a feedback impedance Zx has been added to reflect a fraction of the control voltage Vab back to the Port A side through the inverting amplifier 60 so as to produce gain.

The equations for such implementation, again assuming ideal transformers, are illustrated below:

When transmitting from Port A to Port B, Esb=0, K=R/Zx $$I_1 = Esa \times \frac{Zlsb}{ZaZb + Zlsb[Zlsa - KZa]} \quad (1)$$

$$-I_2 = Esa \times \frac{Za}{ZaZb + Zlsb[Zlsa - KZa]} \quad (2)$$

$$Zin = (ZaZb/Zlsb) - KZa \quad (3)$$

-continued

When transmitting from Port B to Port A, $Esa = 0$  $K = R/Zx$ $$I_2 = Esb \times \frac{Zlsa - KZa}{ZaZb + Zlsb[Zlsa - KZa]} \quad (4)$$

$$I_1 = Esb \times \frac{Zb}{ZaZb + Zlsb[Zlsa - KZa]} \quad (5)$$

$$Zin = ZaZb/(Zlsa - KZa) \quad (6)$$

It is evident that equation (3) is the equation for a series negative impedance, and equation (6) is the equation for a shunt negative impedance.

Figure 5:
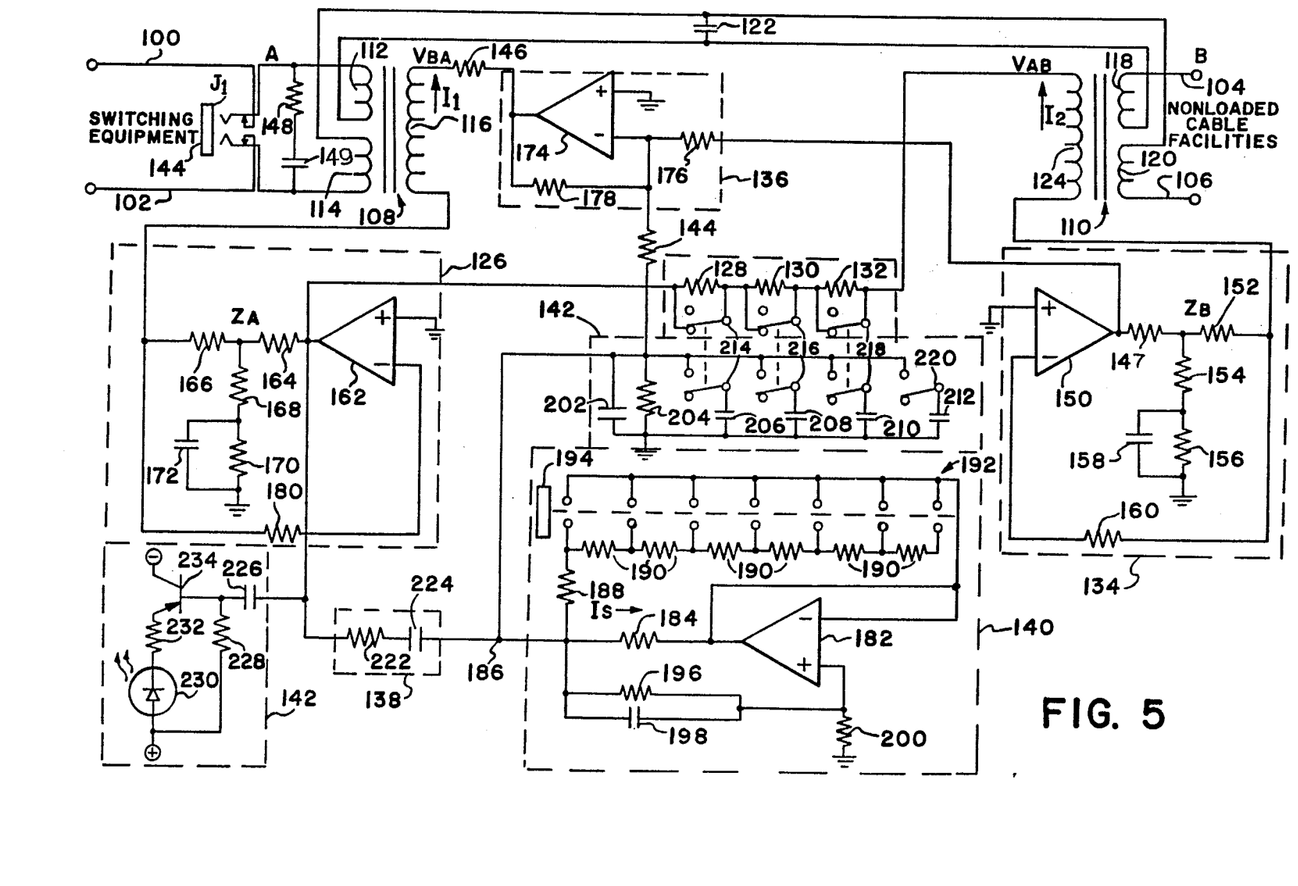
FIG. 5 is a detailed electrical schematic diagram of the reciprocal negative impedance repeater illustrated in FIG. 4 illustrating further refinements for stability and frequency dependent gain equalization.

In FIG. 5 another preferred implementation of a reciprocal negative impedance repeater constructed in accordance with the invention is shown. A frequency dependent gain control has been added to enhance the stability and equalization of an implementation of a reciprocal negative impedance repeater, such as that illustrated in FIG. 4. The gain control consists of two relatively independent parts which vary the gain and impedance of the repeater to compensate for different lengths and gauges of nonloaded cable and their frequency dependent loss and impedance changes. In one part, an incremental gain control is used to match the gain versus frequency slope to cable length and gauge by varying the feedback to the switching equipment side of the repeater. Another part is used to provide optioning for different cable configurations where the overall level of frequency dependent gain is matched to the impedance changes due to cable gauge. The gain control is in general an frequency dependent circuit which varies the feedback to the switching equipment side of the repeater to modify its gain and impedance in accordance with those changes which it perceives in the cable facilities which are attached to its other side.

The repeater illustrated in FIG. 5 is specifically adapted to be connected on the Port A side at terminals 100–102 to the switching equipment of a telephone system. On the Port B side of the repeater at terminals 104 and 106, the repeater is specifically adapted to be connected to the nonloaded cable facilities of the telephone system. The repeater is bidirectional and linear for transmission from Port A to Port B or from Port B to Port A.

The repeater includes a transformer 108 with a split primary and a one-to-one transformer ratio on the Port A side and a transformer 110 with a split primary and a one-to-one transformer ratio on the Port B side. The two equal split primary coils 112 and 114 couple AC transmission signals to the secondary coil 116 of the transformer 108 and bypass battery DC and ringing current to the split primary coils 118 and 120 of the Port B transformer 110. A blocking capacitor 122 of 2.15 microfarads is used to maintain DC separation between the two conductors and present a predetermined capacitance to the input Port A. AC signals of the voice frequency spectrum pass through an impedance converter to the secondary coil 124 of transformer 110 and are output from the dual primary coils 118 and 120 of the transformer 110. Transmission from Port B to Port A reverses the path but is essentially similar.

The current $I_1$ in the secondary winding 116 of transformer 108 is measured by impedance conversion means 126 which outputs a control voltage Vab to the secondary 124 of transformer 110. This signal passes through three series resistances 128, 130 and 132 which can be selectively inserted and removed from the path, as will be more fully explained hereinafter. On the Port B side the impedance conversion means, including voltage source 134 and inverting voltage amplifier 136, measure the current $I_2$ in the secondary 124 of transformer 110 to produce the control voltage Vba at the secondary 116 of transformer 108. A portion of the voltage Vab is fed back to the inverting amplifier 136 by means of the gain control circuitry 138, 140, 142 and resistor 144 as will be more fully explained hereinafter. The circuit provides this configuration with reciprocal negative impedance in each transmission direction.

Further included is a singing detector 142 which along with shorting jack 144 is used to perform an electronic alignment and unconditional stability test for the repeater. A conductive shorting plug inserted in shorting jack 144 will connect the switching equipment terminals of transformer 108 directly together to short circuit Port A. Insertion of the shorting plug in jack 144 will also open terminals 100-102 to disconnect the switching equipment. The singing detector 142 is connected through a decoupling capacitor 226 to the output of impedance conversion means 126. If the voltage is oscillating above a certain frequency, indicating that the repeater is singing, the AC voltage will be passed to the base of a PNP transistor 234 where it will develop a voltage across resistor 228. That voltage will turn the transistor 234 on such that it provides a conduction path through an LED 230, a load resistor 232, and its emitter to collector terminals. The conduction of current through the path will light the LED 230 to provide a visual indication that the repeater is in an unstable or singing mode.

A control impedance 146 is provided between the secondary 116 of the transformer 108 and the output of the inverting voltage amplifier 136. The control impedance 146 forms part of a built in program for the repeater to determine its initial operating point and is for stability purposes. A matching impedance including a resistor 148 and a capacitor 150 is provided in parallel across the primary of transformer 108 on Port A for out of band compensation.

The impedance conversion means 126 and 134 which are identical circuits will now be more fully explained as to their functional operation. For example, the impedance conversion means 134 includes an operational amplifier 150 which has its noninverting input grounded and its output connected through an impedance Zb to the secondary 124 of transformer 110. The complex impedance Zb is made up of the combination of resistors 147, 152, 154, 156 and a capacitor 158. The resistors form a T-network where a shunt leg is provided between two series legs on either side. The shunt leg changes value with respect to frequency due to the parallel connection of resistor 156 with capacitor 158. Therefore, a representation of the complex impedance Zb as a function of frequency is:

$$Zb = R_{152} + R_{147}\left[1 + \frac{R_{152}}{R_{154} + \frac{R_{156}}{(1 + jwR_{156}C)}}\right]$$

By measuring the voltage at the reference terminal of secondary 124 of transformer 110 through resistor 160, the operational amplifier 150 maintains its inverting terminal at ground. It generates a current $I_2$ through Zb thereby producing the inverse of the voltage Vba at its output. This voltage is then inverted in the inverting amplifier 136 to become Vba. Similarly, for the impedance conversion means 126, the impedance Za is connected between the output of an operational amplifier 162 and the reference terminal of secondary 116 of transformer 108. The complex impedance Za as a function of frequency is:

$$Za = R_{166} + R_{164}\left[1 + \frac{R_{166}}{R_{168} + \frac{R_{170}}{(1 + jwR_{170}C_{172})}}\right]$$

The voltage at the reference terminal of secondary 116 of transformer 108 is sensed through resistance 180 and input to the inverting terminal of the amplifier 162. The amplifier 162 varies its output to maintain its inverting terminal at ground. Vab is generated by measuring the current through the impedance Za which is produced to provide $I_1$.

It is noted by definition that Vab and Vba are applied to the terminals of the transformers 108, 110 and $I_1$, $I_2$ are the currents which are caused to circulate in the ports. Therefore, Za=Vab / $I_1$ and Zb=-Vba / $I_2$ which may include impedance contributions in addition to the Za, Zb shown in the preferred embodiment. This analysis is, of course, with resistor 144 open such that there is no feedback. When resistor 144 is connected in the circuit as shown, Vba is equal to a Vba' which is reduced by the fraction of the voltage Vab which is fed back through that circuit path. This feedback, as noted with respect to FIG. 4 and the equations pertaining thereto, provides gain and influences the generation of Vab via its effect on $I_1$. In general, Vba, appears to Port A as a positive reciprocal impedance which is reduced in proportion to the feedback or gain in that direction.

The combination of circuits 140, 142 and resistor 144 provides a frequency dependent feedback for the generation of negative impedance or gain. The circuit 140 includes an operational amplifier 182 having an output resistor 184 connected between its output and a node 186. A resistor 188 is connected in series with a plurality of incremental, but not necessarily equal, resistances 190. A slide switch 192 is used to select varying multiples of the resistances 190 by moving the slide 194 from the left to the right as shown in the drawing. Movement of slide 194 connects increasing increments of resistances 190 in series with resistor 188. The terminal of slide switch 192 is connected to the inverting input of the amplifier 182. The circuit 140 further includes the parallel combination of a resistor 196 and a capacitor 198 connected between the node 186 and the noninverting input of the amplifier 182. The noninverting input of the amplifier 182 is further referenced through a resistor 200.

In this configuration the circuit 140 performs as an active inductor whereby increasing increments of resistance from slide switch 192 increases the impedance between the node 186 and the reference voltage. This provides a frequency dependent adjustment for a parallel RLC tank circuit of which circuit 140 is the L. The operational amplifier 182 acts to balance the voltages appearing at its inverting and noninverting inputs by controlling the current Is through an equivalent resistance Rs connected between its output and node 186. The equivalent resistance Rs is the parallel combination of resistor 184 and resistor 188 along with any of the added resistors 190. Adding resistors 190 in series with resistor 188 serves to increase the equivalent resistance Rs and decrease the current Is for a given voltage between node 186 and the inverting input.

The voltage between these two points is frequency dependent because of capacitor 198 and Is will vary not only because of slide switch 192 but also with frequency. The voltage at the noninverting input (and consequently at the inverting) is set by the divider voltage provided by resistors 196 and 200. At low frequencies the voltage approximates:

$$V_{182(IN)} = \frac{V_{186}R_{200}}{R_{200} + R_{196}}$$

where the effects of the capacitor 198 are nominal. When the voltage at node 186 increases in frequency, the capacitor 198 changes impedance and increasingly shunts resistor 196. Therefore, as frequency increases, the voltage at the noninverting input increases toward $V_{186}$ where the capacitor 198 completely shorts the resistor 196. As the voltage rises with frequency at the noninverting input, it also rises comparably at the inverting input to decrease the voltage difference across Rs with a consequent decrease in Is. Decreasing the current Is through Rs causes the circuit 140 to appear to node 186 as an impedance which increases with frequency, and therefore an inductor.

The circuit 142 is the parallel combination of a resistor 204, a capacitor 202, and a plurality of capacitors 206, 208, 210 and 212 which can be switched in parallel with the resistor 204 and capacitor 202 via optioning switches 214, 216, 218 and 220 respectively. Together circuit 140 and 142 form a parallel RLC tank circuit whose capacitance C can be adjusted by closing different switches 214, 216, 218 or 220 to combine capacitance with capacitor 202 whose inductance L can be changed by varying the slide 194 of slide switch 192, and whose R is resistor 204. The RLC circuit is connected in parallel at node 186 with the feedback resistor 144. The control voltage Vab is coupled to the node through a network comprising resistor 222 and capacitor 224.

The parallel tank circuit presents a varying complex impedance in shunt with resistor 144 to change the fraction of the negative feedback voltage applied to Port A. The fraction is $R_{178}/Zx$ where Zx is the shunt combination of resistance $R_{144}$ and Zt, the impedance of the parallel tank. The larger the impedance Zt is, the larger the fraction of the voltage at node 186 which is fed back to Port A.

Thus, when slide switch 192 is used to decrease Is, or when increases in frequency cause a decrease in Is, the impedance of the tank circuit increases, and with it the gain or fraction of the voltage $V_{186}$ fed back to Port A. The circuit 140 provides a gain with a positive slope which increases with frequency to offset the increasing loss with frequency for nonloaded cable. The slide 192 varies the slope to match the gauge and length of cable attached.

The gain circuit is manufactured with the ability to create singing or instability with the maximum impedance of the cable facilities connected at Port B. This will provide the basis for a convenient alignment test as discussed hereinafter. If the gain is originally set just under this point, then the repeater will be stable for all other conditions because the impedance of the cable facilities will decrease with length and frequency, and the cable port becomes more stable with decreasing impedance. In general, the maximum impedance of the cable facilities will occur at DC, but taking into account the inductance of transformer 110, the effective maximum impedance of the illustrated circuit occurs about 270 Hz. This frequency is still considered out of band for the VFR and can be used as a stability test point.

To increase instability for setting the test point where desired, the gain around the repeater loop can be increased by decreasing the values of resistors 146, and 196. These values are factory selected so that the repeater will be stable at a selected point with the highest gain setting of the slide switch 192. In general, this is set with the longest loop (15 kft.) and smallest gauge cable (26 g) for which the repeater is designed. An adequate gain range for shorter loop lengths is provided by the other settings of the slide switch 192. In this manner, the gain can be increased to the point just under where instability occurs. Thus, as frequency increases and gain must increase to make up for increasing loss, it will not cause the repeater to become unstable. This is because the highest gain slope has been set for the worst case impedance and frequency and the conditions affecting the stability of the repeater only improve thereafter.

The option switches 204, 206 and 208 are used to change the Q of the detuned tank circuit to increase the feedback level at higher frequencies. Such addition of capacitance not only increases the gain slope with frequency but also moves the slope toward higher frequencies to shift the level of the feedback. The resistors 128, 130, and 132 are used with the option capacitors 206, 208, and 210 respectively to reduce the amount of $I_2$ driving the secondary of transformer 110. With the coarser gauge cables, for example 24 gauge and especially 22 gauge, Vab causes a larger amount of $I_2$ in driving the cable because of their lower impedance. However, due to the reciprocal nature of the network, this creates positive impedance at Port A which requires more feedback to obtain the gain needed. The resistors 128, 130, and 132 reduce $I_2$, thereby decreasing Vba and enhancing the effect of the feedback. By setting the level for the feedback by the optioning capacitors and resistors, the range of the slide switch can supply the needed frequency variable gain with the correct slope for different ranges or cable gauges.

When switch 214 is closed capacitor 206 is placed in parallel with the RLC tank circuit and resistor 128 is inserted in the serial path from Vab to terminal. When switch 216 is closed capacitor 208 is inserted in the tank circuit and resistor 130 is inserted in series in the path from Vab to terminal. When switch 218 is closed capacitor 210 is inserted in the parallel tank circuit and resistor 132 inserted in series in the path between Vab and terminal. Capacitor 212 is inserted in the parallel tank circuit by closing switch 220. The switches 214, 216, 218 and 220 are used individually to provide settings for different cable types and, if not set, their associated resistances are shorted out and their associated capacitors are not in the circuit.

FIG. 6 shows an actual example of how the frequency dependent gain circuit equalizes the losses in nonloaded cable. Graphical representation A represents the increasing loss in dB for a 26 gauge nonloaded cable 15 kft in length as a function of frequency over the voice band. Graphical curve B represents the loss of a repeatered cable of the same type and length using the circuit implementation shown in FIG. 5. It is seen that the loss is essentially flat over the voice frequency band from 300–3000 Hz.

The electronic alignment of the repeater illustrated in FIG. 5 and a test for unconditional stability are easily accomplished with only one test person and without specialized equipment. A shorting plug is inserted in shorting jack 144 which connects terminals 100, 102 together to provide a "worst case" condition for Port A. The nonloaded cable is left on hook or idle to provide a "worst case" condition for Port B. The gain slide switch 194 is then advanced one increment at a time until the repeater sings. The singing detector visually indicates when stability is not maintained, and the operator then backs the slide switch 194 off one increment so that the LED 230 does not light. At this point the repeater is unconditionally stable and the shorting plug in jack 144 is removed.

While the present invention has been illustrated and described in conjunction with the various preferred embodiments, it is to be understood that numerous changes and modifications may be made thereto without departing from the scope of the present invention as is hereinafter defined in the appended claims.

What is claimed is:

1. An impedance conversion repeater for bidirectional communications from a switching equipment source generator having a switching equipment source impedance to a subscriber loop load impedance in a first direction, and from a subscriber loop source generator having a subscriber loop source impedance to a switching equipment load impedance in a second direction, comprising:

a switching equipment port for connection to switching equipment;

a subscriber loop port for connection to a cable comprising a portion of a subscriber loop;

first impedance conversion means coupled to the switching equipment port, for transmission of a switching equipment signal from the switching equipment port to the subscriber loop port in the first direction, and for controlling an input impedance of the subscriber loop part to be proportional to a reciprocal of a switching equipment load impedance connected to the switching equipment port;

second impedance conversion means coupled to the subscriber loop port, for transmission of a subscriber loop signal from the subscriber loop port to the switching equipment port in the second direction, and for controlling an input impedance of the switching equipment port to be proportional to a reciprocal of a subscriber loop load impedance connected to the subscriber loop port; and negative impedance means connected to one of said ports for producing an effect upon bidirectional communications substantially similar to that produced by a series negative impedance connected in series with the switching equipment port.

2. An impedance conversion repeater as set forth in claim 1 wherein said first impedance conversion means comprises means for generating a first control voltage for application to the subscriber loop port which is proportional to a switching equipment current of the switching equipment port and a first control impedance; and the second impedance conversion means comprises means for generating a second control voltage for application to the switching equipment port which is proportional to a subscriber loop current of the subscriber loop port and a second control impedance.

3. An impedance conversion repeater as set forth in claim 2 wherein:

said first control voltage generating means generates said first control voltage according to the equation:

$$Z_a = V_{ab}/I_1$$

where
   $V_{ab}$ is said first control voltage
   $I_1$ is the switching equipment current, and
   $Z_a$ is said first control impedance; and
   said second control voltage generating means generates said second control voltage according to the equation:

$$Z_b = -V_{ba}/I_2$$

where
   $V_{ba}$ is said second control voltage
   $I_2$ is the subscriber loop current, and
   $Z_b$ is said second control impedance.

4. An impedance conversion repeater for bidirectional communications from a source generator and a source impedance to a load impedance, comprising:

a first port;

a second port;

first means for impedance conversion coupled to the first port, for transmission of a first signal from said first port to said second port and for controlling an input impedance of said second port to be proportional to a reciprocal of a load impedance applied to said first port;

second means for impedance conversion coupled to the second port, for transmission of a second signal from said second port to said first port and for controlling an input impedance of said first port to be proportional to a reciprocal of a load impedance applied to said second port; and negative impedance means connected to one of said ports, for producing an effect upon bidirectional communications substantially similar to that produced by a series negative impedance connected in series with the first port.

5. An impedance conversion repeater as set forth in claim 4 wherein said first impedance conversion means comprises means for generating a first control voltage for application to said second port which is proportional to a current of said first port and a first control impedance; and said second impedance conversion means comprises means for generating a second control voltage for application to said first port which is proportional to a current of said second port and a second control impedance.

6. An impedance conversion repeater as set forth in claim 5 wherein said first control voltage generating means generates said first control voltage according to the equation:

$$Z_a = V_{ab}/I_1$$

where
$V_{ab}$ is said first control voltage,
$I_1$ is the current of said first port, and
$Z_a$ is said first control impedance; and
said second control voltage generating means generates said second control voltage according to the equation:

$Z_b = -V_{ba}/I_2$ where
V<sub>ba</sub> is said second control voltage
$I_2$ is the current of said second port, and
$Z_b$ is said second control impedance.

7. An impedance conversion repeater as set forth in claim 5 wherein the negative impedance means comprises means for generating a third control voltage for application to said first port which is proportional to said first control voltage and a third control impedance.

8. An impedance conversion repeater as set forth in claim 5 wherein said first control impedance is not equal to said second control impedance.

9. An impedance conversion repeater as set forth in claim 5 wherein said first control voltage generating means comprises an operational amplifier having an inverting input terminal, a noninverting input terminal, and an output terminal, wherein said output terminal generates a current operable to balance any difference in currents at the inverting and noninverting input terminals, said operational amplifier having said first control impedance connected between said output terminal and said inverting input terminal and having the noninverting input terminal connected to a reference voltage, said inverting input terminal further being connected to said first port and said output terminal being connected to said second port.

10. An impedance conversion repeater as set forth in claim 5 wherein said second control voltage generating means comprises a second impedance conversion operational amplifier having an input inverting terminal, a noninverting input terminal, and an output terminal, wherein said output terminal generates a current operable to balance any difference in currents at the inverting and noninverting input terminals, said second impedance conversion operational amplifier having said second control impedance connected between said output terminal of said second impedance conversion operational amplifier and said inverting input terminal of said second impedance conversion operational amplifier and the inverting input terminal of said second impedance conversion operational amplifier being connected to a reference voltage, said inverting input terminal of said second impedance conversion operational amplifier further being connected to said second port; and an inverting voltage amplifier having an input and an output wherein said output terminal of said second impedance conversion operational amplifier is connected to the input of said voltage amplifier and the output of said voltage amplifier is connected to said first port.

11. An impedance conversion repeater as set forth in claim 5 wherein said first control voltage generating means comprises a first impedance conversion operational amplifier having an input inverting terminal, a noninverting input terminal, and an output terminal, wherein said output terminal generates a current operable to balance any difference in currents at the inverting and noninverting input terminals, said first impedance conversion operational amplifier having said first control impedance connected between said output terminal of said first impedance conversion operational amplifier and said first port, having a first feedback impedance connected between said first port and said inverting input terminal of said first impedance conversion operational amplifier and the noninverting input terminal of said first impedance conversion operational amplifier being connected to a reference voltage, and further having said output terminal of said first impedance conversion operational amplifier being connected to said second part.

12. An impedance conversion repeater as set forth in claim 5 wherein said second control voltage generating means comprises a second impedance conversion operational amplifier having an inverting input terminal, a noninverting input terminal, and an output terminal, wherein said output terminal generates a current operable to balance any difference in currents at the inverting and noninverting input terminals; said second impedance conversion operational amplifier having said second control impedance connected between said output terminal of said second impedance conversion operational amplifier and said second port, having a first feedback impedance connected between said second port and said inverting input terminal of said second impedance conversion operational amplifier and having the noninverting input terminal of said second impedance operational amplifier connected to a reference voltage; and an inverting voltage amplifier having an input and an output wherein said output terminal of said second impedance conversion operational amplifier is further connected to the input of said voltage amplifier and the output of said voltage amplifier is connected to said first port.

13. An impedance conversion repeater as set forth in claim 10 wherein said inverting voltage amplifier comprises an inverting voltage operational amplifier having an inverting input terminal, a noninverting input terminal, and an output terminal, wherein said output terminal of said inverting voltage operational amplifier generates a current operable to balance any difference in currents at the inverting and noninverting input terminals of said inverting voltage operational amplifier, said inverting voltage operational amplifier having a feedback resistance connected between its output terminal and its inverting input terminal and having its noninverting input terminal connected to a reference voltage, its inverting input terminal further being connected through an input resistance to the output terminal of the second control voltage generating means impedance conversion operational amplifier.

14. An impedance conversion repeater as set forth in claim 13 which further comprises a feedback impedance connected between the voltage output of said means for generating a first control voltage and the inverting terminal input of said inverting voltage operational amplifier.

15. An impedance conversion repeater as set forth in claim 12 wherein said inverting voltage amplifier comprises an inverting voltage operational amplifier having an inverting terminal, a noninverting terminal, and an output terminal, wherein said output terminal of said inverting voltage operational amplifier generates a current operable to balance any difference in currents at the inverting and noninverting terminals of said inverting voltage operational amplifier, said inverting voltage operational amplifier having a feedback resistance connected between said output terminal of said inverting voltage operational amplifier and said inverting input terminal of said inverting voltage operational amplifier, and said noninverting input terminal of said inverting voltage operational amplifier being connected to a reference voltage, and said inverting input terminal of said inverting voltage operational amplifier further being connected through an input resistance to the output terminal of the second control voltage generating means impedance conversion operational amplifier.

16. An impedance conversion repeater as set forth in claim 15 which further comprises a feedback impedance connected between the voltage output terminal of the first control voltage generating means impedance conversion operational amplifier and the inverting input of said inverting voltage operational amplifier.

17. An impedance conversion repeater as set forth in claim 10 wherein said feedback impedance is frequency dependent.

18. An impedance conversion repeater for bidirectional communications from a source generator and a source impedance to a load impedance comprising:
  a first port;
  a second port;
  first impedance conversion means coupled to the first port and to the second port, for transmission of a first signal from said first port to said second port and for controlling an input impedance of the first port to be proportional to a reciprocal of a load impedance applied to said second port, the first impedance conversion means having means for generating a first control voltage for application to the second port which is proportional to a first current of said first port and a first control impedance;
  second impedance conversion means coupled to the first port and to the second port, for transmission of a second signal from the second port to the first port and for controlling an input impedance of the second port to be proportional to a reciprocal of a load impedance applied to said first port, having means for generating a second control voltage for application to the first port which is proportional to a second current of said second port and a second control impedance, said first control impedance being unequal to said second control impedance; and
  negative impedance means connected to one of said ports, for producing an effect upon communications substantially similar to that produced by a series negative impedance connected in series with the first port and having means for generating a third control voltage for application to said first port which is proportional to said first control voltage and a third control impedance which is frequency dependent.

19. An impedance conversion repeater for bidirectional communications from a source generator and a source impedance to a load impedance, comprising:
  a first port;
  a second port;
  first means for impedance conversion coupled to the first port, for transmission of a first signal from said first port to said second port and for controlling an input impedance of said first port to be proportional to a reciprocal of a load impedance applied to said second port and having means for generating a first control voltage for application to said second port which is proportional to a current of said first port and a first control impedance;
  second means for impedance conversion coupled to the second port, for transmission of a second signal from said second port to said first port and for controlling an input impedance of said second port to be proportional to a reciprocal of a load impedance applied to said first port and having second means for generating a second control voltage for application to said first port which is proportional to a current of said second port and a second control impedance;
  said control voltage means comprising an impedance conversion operational amplifier having an inverting terminal, a noninverting terminal, and an output terminal, wherein said output terminal generates a current operable to balance any difference in currents at the inverting and noninverting terminals, said impedance conversion operational amplifier having said second control impedance connected between said output terminal and one of said input terminals and the other input terminal connected to a reference voltage, said one input terminal further being connected to said second port, and
  an inverting voltage amplifier having a noninverting input terminal, an inverting input terminal and an output terminal, said output terminal presenting said second control voltage to said first output port; wherein said output terminal generates a current operable to balance any difference in currents at the inverting and noninverting input terminals, said inverting voltage operational amplifier having a feedback resistance connected between its output terminal and its inverting input terminal and having its noninverting input terminal connected to a reference voltage, its inverting input terminal further being connected through an input resistance to the output of the second control voltage generating means impedance conversion operational amplifier and a frequency dependent feedback impedance connected between the voltage output of said means for generating a first control voltage and the inverting input terminal of said inverting voltage amplifier.

20. An impedance conversion repeater for bidirectional communications from a source generator having a source impedance to a load impedance in one direction, and from another source generator having another source impedance to another load impedance in the other direction, said impedance conversion repeater comprising:
  a first port connected to the source generator and to the another load impedance;
  a second port connected to the another source generator and to the load impedance;
  first impedance conversion means connected between said first and second ports, having first means for generating a first control voltage to said second port based on a current input to said first port which opposes the another source generator for transmission in said another direction and drives the load impedance for transmission in said one direction;
  second impedance conversion means connected between said first and second ports, having second means for generating a second control voltage to said first port based on a current input to said second port which opposes the source generator for transmission in said one direction and drives the another load impedance for transmission in the another direction; and
  negative impedance means connected to at least one of the ports for producing an effect upon bidirectional communications substantially similar to that produced by a series negative impedance connected in series with one of said ports.

21. An impedance conversion repeater as set forth in claim 20 wherein said first control voltage generating means generates said first control voltage according to the equation:

$$Za = Vab/I_1$$

where
Vab is said first control voltage,
$I_1$ is the current of said first port, and
Za is said first control impedance; and
said second control voltage generating means generates said second control voltage according to the equation;

$$Zb = = Vba/I_2$$

where
Vba is said second current voltage
$I_2$ is the current of said second port, and
Zb is said second control impedance.

22. An impedance conversion repeater as set forth in claim 21 wherein, for transmission in the one direction:
the input impedance of said first port is controlled according to the equation:

$$Zin(A \text{ to } B) = Za \times Zb/Zlsb$$

where
Zin(A to B) is the input impedance of said first port, and
Zlsb is the load impedance.

23. An impedance conversion repeater as set forth in claim 21 wherein, for transmission in the other direction;
the input impedance of said second port is controlled according to the equation:

$$Zin(B \text{ to } A) = Za \times Zb/Zlsa$$

where
Zin(B to A) is the input impedance of said second port, and
Zlsa is the another load impedance.

24. An impedance conversion repeater for bidirectional communications from a source generator having a source impedance to a load impedance in one direction, and from another source generator having another source impedance to another load impedance in the other direction, said impedance conversion repeater comprising:
a first port connected to the source generator and to the another load impedance;
a second port connected to the another source generator and to the load impedance;
first impedance conversion means connected between said first and second ports, for generating a control voltage to said first port based on a current input to said second port which opposes the source generator for transmission in said one direction and drives the another load impedance for transmission in said other direction;
second impedance conversion means connected between said first and second ports, for generating a control voltage to said second port based on a current input to said first port which opposes the another source generator for transmission in said other direction and drives the load impedance for transmission in the one direction; and
negative impedance means connected to at least one of the ports for producing an effect upon bidirectional communications substantially similar to that produced by a series negative impedance connected in series with one of said ports wherein said first control voltage generating means generates said first control voltage according to the equation:

$$Za = Vab/I_1$$

where
Vab is said first control voltage,
$I_1$ is the current of said first port, and
Za is said first control impedance; and
said second control voltage generating means generates said second control voltage according to the equation:

$$Zb = -Vba/I_2$$

where
Vba is said second control voltage
$I_2$ is the current of said second port, and
Zb is said second control impedance; and
the current of said second port $-I_2$ is generated according to the equation:

$$-I_2 = (Esa \times Za)/(ZaZb + Zlsa\ Zlsb)$$

where
Esa is the voltage of the source generator
Zlsa is the source impedance, and
Zlsb is the load impedance.

25. An impedance conversion repeater for bidirectional communications from a source generator having a source impedance to a load impedance in one direction, and from another source generator having another source impedance to another load impedance in the other direction, said impedance conversion repeater comprising:
a first port connected to the source generator and to the another load impedance;
a second port connected to the another source generator and to the load impedance;
first impedance conversion means connected between said first and second ports, for generating a control voltage to said first port based on a current input to said second port which opposes the source generator for transmission in said one direction and drives the another load impedance for transmission in said other direction;
second impedance conversion means connected between said first and second ports, for generating a control voltage to said second port based on a current input to said first port which opposes the another source generator for transmission in said other direction and drives the load impedance for transmission in the one direction; and
negative impedance means connected to at least one of the ports for producing an effect upon bidirectional communications substantially similar to that produced by a series negative impedance connected in series with one of said ports wherein: said first control voltage generating means generates said first control voltage according to the equation:

$$Za = Vab/I_1$$

where
Vab is said first control voltage,
$I_1$ is the current of said first port, and
Za is said first control impedance; and
said second control voltage generating means generates said second control voltage according to the equation:

$$Zb = -Vba/I_2$$

where
Vba is said second control voltage
$I_2$ is the current of said second port, and
Zb is said second control impedance; and
wherein, for transmission in the other direction:
the current of said first port $I_1$ is generated according to the equation:

$$I_1 = (Esb \times Zb)/(ZaZb + Zlsa\, Zlsb)$$

where
Esb is the voltage of the another source generator,
Zlsa is the another load impedance, and
Zlsb is the another source impedance.

26. An impedance conversion repeater for bidirectional communications from a source generator having a source impedance to a load impedance in one direction, and from another source generator having another source impedance to another load impedance in the other direction, said impedance conversion repeater comprising:
a first port connected to the source generator and to the another load impedance;
a second port connected to the another source generator and to the load impedance;
first impedance conversion means connected between said first and second ports, for generating a control voltage to said first port based on a current input to said second port which opposes the source generator for transmission in said one direction and drives the another load impedance for transmission in said other direction;
second impedance conversion means connected between said first and second ports, for generating a control voltage to said second port based on a current input to said first port which opposes the another source generator for transmission in said other direction and drives the load impedance for transmission in the one direction; and
negative impedance means connected to at least one of the ports for producing an effect upon bidirectional communications substantially similar to that produced by a series negative impedance connected in series with one of said ports wherein: said first control voltage generating means generates said first control voltage according to the equation:

$$Za = Vab/I_1$$

where
Vab is said first control voltage,
$I_1$ is the current of said first port, and
Za is said first control impedance; and
said second control voltage generating means generates said second control voltage according to the equation:

$$Zb = -Vba/I_2$$

where
Vba is said second control voltage
$I_2$ is the current of said second port, and
Zb is said second control impedance; and means for generating a third control voltage for application to said first port said third voltage being a product of a proportionality constant between 0 and 1 and said first control voltage.

27. An impedance conversion repeater as set forth in claim 26 wherein, for transmission in the one direction:
the input impedance of said first port is controlled according to the equation:

$$Zin(A \text{ to } B) = (ZaZb/Zlsb) - KZa$$

where
Zin(A to B) is the input impedance to said first port,
Zlsb is the load impedance, and
$-K$ is said proportionality constant.

28. An impedance conversion repeater as set forth in claim 26 wherein, for transmission in the another direction:
the input impedance of said second port is controlled according to the equation:

$$Zin(B \text{ to } A) = ZaAb/(Zlsa - KZa)$$

where
Zin(B to A) is the input impedance to said second port,
Zlsa is the another load impedance; and
$-K$ is said proportionality constant.

29. An impedance conversion repeater as set forth in claim 26 wherein, for transmission in the one direction:
the current $I_1$ of said first port is generated according to the equation:

$$I_1 = Esa \times \frac{Zlsb}{ZaZb + Zlsb[Zlsa - KZa]} \text{ ; and}$$

the current $-I_2$ of said second port is generated according to the equation:

$$-I_2 = Esa \times \frac{Za}{ZaZb + Zlsb[Zlsa - KZa]} ;$$

where
Esa is the voltage of the source generator,
Zlsa is the source impedance,
Zlsb is the load impedance, and
$-K$ is said proportionality constant.

30. An impedance conversion repeater as set forth in claim 26 wherein, for transmission in the other direction:
the current $I_1$ of said first port is generated according to the equation:

$$I_1 = Esb \times \frac{Zb}{ZaZb + Zlsb[Zlsa - KZa]} \text{ ; and}$$

the current $I_2$ of said second port is generated according to the equation:

$$I_2 = Esb \times \frac{Zlsa - KZa}{ZaZb + Zlsb[Zlsa - KZa]}$$

where
Esb is the voltage of the another source generator,
Zlsa is the another load impedance,
Zlsb is the another source impedance, and
$-K$ is said proportionality constant.

* * * * *

UNITED STATES PATENT AND TRADEMARK OFFICE
CERTIFICATE OF CORRECTION

PATENT NO. : 4,942,603
DATED : July 17, 1990
INVENTOR(S) : Charles W. Chambers

It is certified that error appears in the above-identified patent and that said Letters Patent is hereby corrected as shown below:

Column 11, line 40, change "150" to --149--.
Column 12, line 35, change "Vba," to --Vba'--.

Column 15, line 42, change "part" to --port--.
Column 16, line 9, after "voltage" insert a comma.
Column 18, line 2, change "part" to --port--.
Column 19, line 10, change "10" to --16--.
Column 21, line 15, change the semicolon to a colon.
Column 21, line 18, change "Zb = =Vba/$I_2$" to --Zb = -Vba/$I_2$--.
Column 21, line 36, change the semicolon to a colon.
Column 24, line 24, change "ZaAb" to --ZaZb--.

Signed and Sealed this

Seventh Day of April, 1992

Attest:

HARRY F. MANBECK, JR.

*Attesting Officer*     *Commissioner of Patents and Trademarks*